United States Patent [19]

Wahl et al.

[11] 4,245,189

[45] Jan. 13, 1981

[54] PROBE ASSEMBLY FOR MEASURING CONDUCTIVITY OF PLATED THROUGH HOLES

[75] Inventors: Robert O. Wahl, Sound Beach; Derek Lieber, North Merrick; Jay M. Lesser, Freeport, all of N.Y.

[73] Assignee: UPA Technology, Inc., Syosset, N.Y.

[21] Appl. No.: 48,547

[22] Filed: Jun. 14, 1979

[51] Int. Cl.³ .................. G01R 1/06; G01R 27/14
[52] U.S. Cl. ......................... 324/65 P; 324/64; 324/158 P
[58] Field of Search .............. 324/65 P, 64, 72.5, 324/158 P; 339/108 TP

[56] References Cited

U.S. PATENT DOCUMENTS

| 902,753 | 11/1908 | Marshall | 324/65 P |
| 4,042,880 | 8/1977 | Weinstock | 324/64 |

*Primary Examiner*—Ernest F. Karlsen
*Attorney, Agent, or Firm*—Nims, Howes, Collison & Isner

[57] ABSTRACT

An improved probe assembly for measuring the conductivity of a plated through hole in a circuit board. The probe assembly having a longitudinal housing and including at the forward end thereof a segmented current injection electrode, each segment being spring biased forwardly and capable of independent movement longitudinally with respect to the housing between a forward position and rearward position. The segmented current injection electrode injecting current into the through hole substantially 360° of the circular edge formed by the intersection of the walls defining the through hole and the surface of the circuit board. A voltage measurement electrode being a knife-blade electrode is positioned in the interstices between the segments of the current injection electrode. The voltage measurement electrode also being spring biased in a forward direction and capable of longitudinal movement between a forward position and a rearward position. The voltage measurement electrode contacting the circular edge of the through hole at multiple points to insure a good electrical contact for voltage measurement.

18 Claims, 9 Drawing Figures

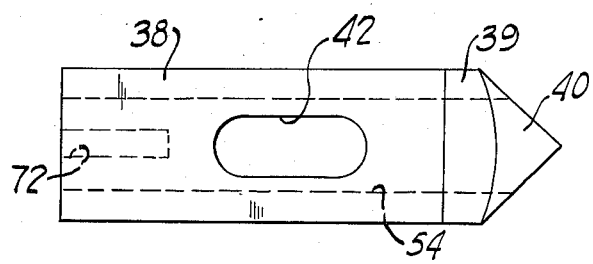
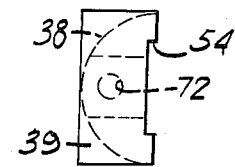
FIG.4  FIG.5
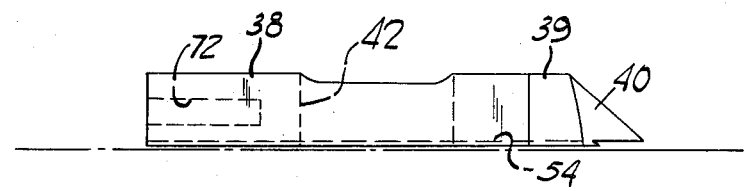
FIG.6
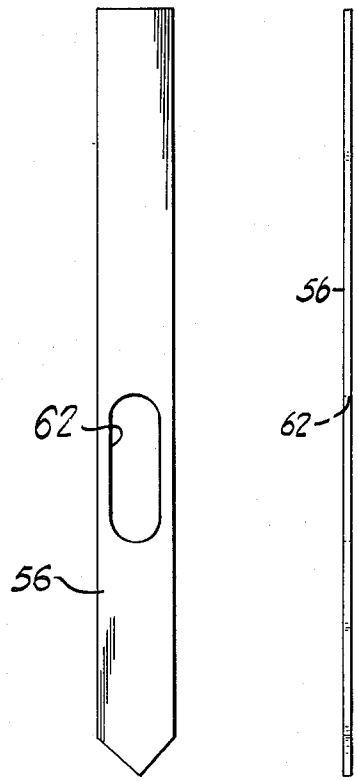
FIG.7  FIG.8
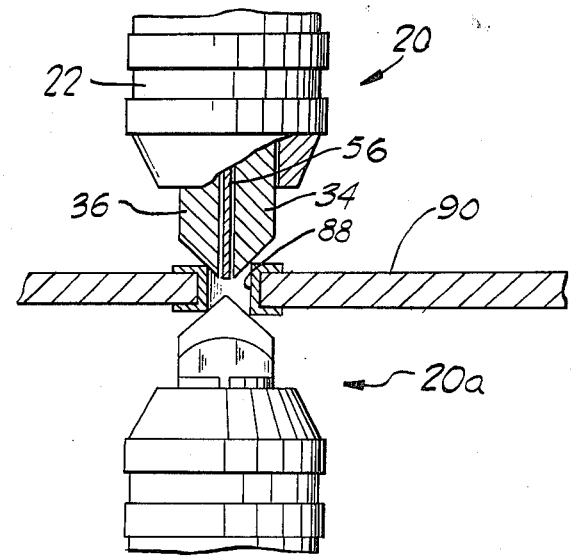
FIG.9

PROBE ASSEMBLY FOR MEASURING CONDUCTIVITY OF PLATED THROUGH HOLES

BACKGROUND OF INVENTION

This invention relates to instruments for measuring the conductivity of thin layers or coatings of electrically conductive material within apertures or holes and particularly to instruments for measuring the plating thickness or conductivity of electrically conductive material on the walls defining a through hole in printed circuit boards.

Two pairs of electrodes, one pair on each side of the through hole are used for measuring the conductivity of plated through holes. One electrode of each pair is used for injecting current into the through hole and the other electrode of each pair is used for measuring the resulting voltage drop across the through hole. This technique is old in the art and is commonly referred to as the Kelvin technique or four-point measurement technique.

Electrical probe assemblies of various configurations are known such as described in U.S. Pat. No. 902,753; U.S. Pat. No. 2,142,619; U.S. Pat. No. 2,208,023; U.S. Pat. No. 2,437,697; U.S. Pat. No. 3,042,862; U.S. Pat. No. 3,192,474; U.S. Pat. No. 3,335,358; U.S. Pat. No. 3,676,776; British Pat. No. 922,225; W. Gee et al. A *Versatile Over-Under Four-Point Probe Apparatus*, J. Physics E. (GB), January, 1971, pp. 70-72; and R. M. Murcko, *Split-Tip for Terminal Resistance Measurements*, IBM Technical Disclosure Bulletin, July, 1971, p. 479.

Instruments for measuring the effective thickness of through hole plating in circuit board workpieces have been developed such as U.S. Pat. No. 3,776,470; U.S. Pat. No. 3,885,215; U.S. Pat. No. 4,042,880; and British Pat. No. 1,244,572. Apparatus of the type described in these patents utilize four-point techniques to measure the conductivity of through holes. These types of electrode assemblies are characterized by having an electrode tip divided into a current injection portion and a voltage measurement portion which are fixed relative to one another.

Electrical probe assemblies for measuring resistance having spring biased electrodes are described, for example; in U.S. Pat. No. 2,885,648 and U.S. Pat. No. 3,229,200. However, with the two types of electrodes shown, it is not possible to get substantially a full 360° current injection by the current electrode and also at the same time insure good contact for the voltage electrode with the through hole.

SUMMARY OF INVENTION

The present invention overcomes the disadvantages of known instruments for measuring the thickness of through hole platings in circuit board workpieces by providing apparatus for injecting current substantially a full 360° into the through hole and also incorporating a voltage electrode for making multiple contacts with the through hole to insure a good electrical contact between the voltage electrode and the walls of the through hole.

The improved electrode probe assembly includes an elongated housing having a longitudinal axis. A segmented current injection electrode having an interstice between adjacent segments is mounted within the housing with a tip portion extending beyond a forward terminal end of the housing. Preferably each segment of the current injection electrode is independently movable in a longitudinal direction with respect to the housing. A knife-blade voltage electrode is mounted in an interstice between the segments of the current injection electrode.

The forward tip of the current injection electrode is shaped to engage the circular edge formed by the intersection of a wall defining the circular through hole and the surface of the circuit board workpiece. The knife-blade voltage measurement electrode is also shaped to engage such circular edge when the current injection electrode engages such circular edge.

In a preferred embodiment, the current injection segments are spring biased in the forward direction but are movable against the spring bias to a rearward position. When the probe assembly is positioned for measuring plating thickness of a through hole, the current injection segments are brought into engagement with the circular edge of the through hole and are moved against the spring bias into the housing until each segment thereof is stopped by a stop means. With the current electrode extended to its most forward position, the voltage electrode is recessed behind the forward tips of the current injection segments. When the current injection segments engage the through hole and are pushed rearwardly against the spring, the voltage tip is exposed.

Thus, with the present invention there is substantially a full 360° of current injection into the through hole. There is also multiple engagement of the through hole by the voltage measurement electrode thereby insuring good electrical contact by the voltage electrode.

For a better understanding of the invention, reference may be made to the following description of a representative embodiment, taken in conjunction with the figures of the accompanying drawings in which:

FIG. 4 is a plan view of a current injection electrode segment according to the present invention;

FIG. 5 is a right hand side view of the current injection electrode segment shown in FIG. 4;

FIG. 6 is an elevational view of the current injection electrode segment shown in FIG. 4;

FIG. 7 is a plan view of a voltage electrode according to the present invention;

FIG. 8 is a right hand side view of the voltage electrode shown in FIG. 7;

FIG. 9 is a partial elevational view of a probe assembly constructed in accordance with the principles of this invention with portions broken away and schematically showing a circuit board with a through hole together with a second probe assembly positioned for making a four-point measurement.

DESCRIPTION OF A PREFERRED EMBODIMENT

Figure 1:
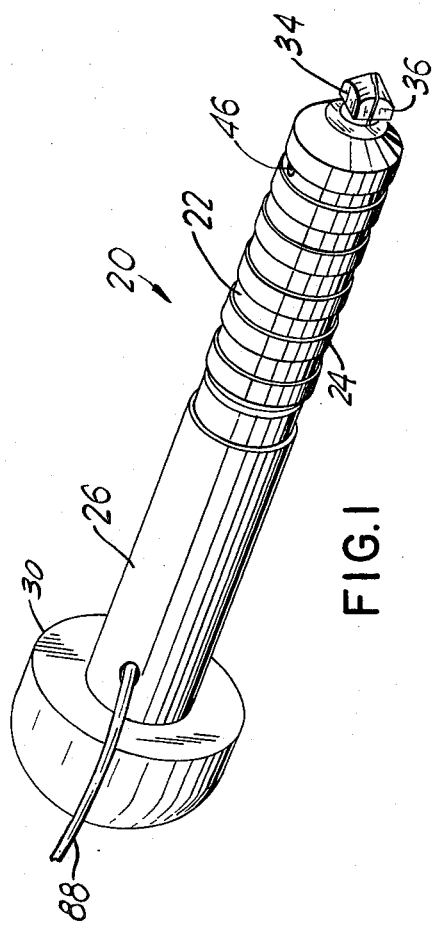
FIG. 1 is a perspective view showing the probe assembly according to the present invention.
Figure 2:
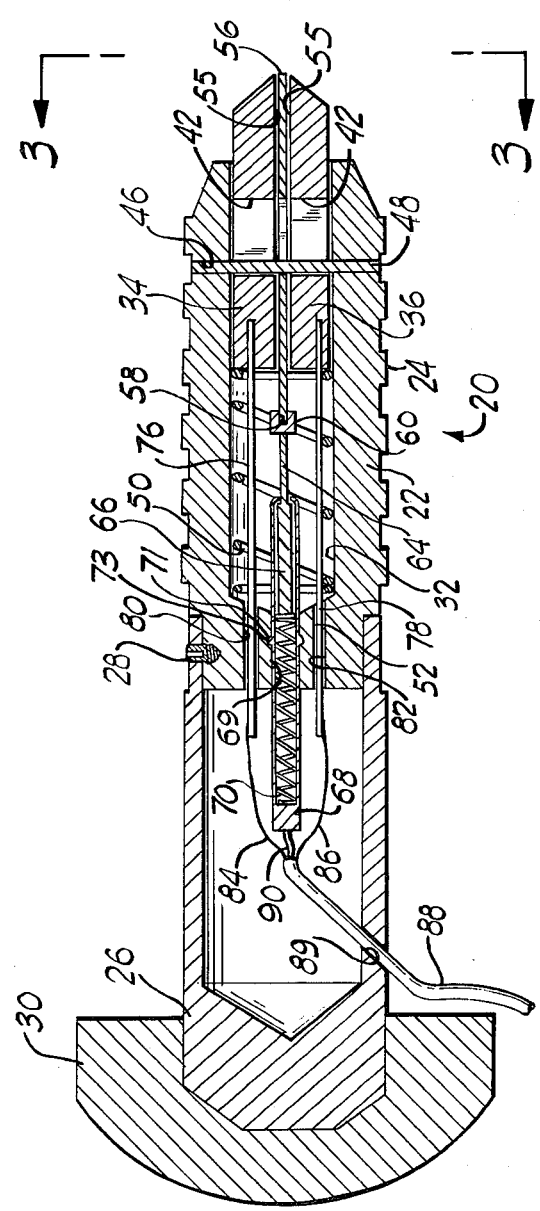
FIG. 2 is a longitudinal cross-sectional view of the probe assembly shown in FIG. 1.

In the embodiment illustrated in FIG. 1, a hand held probe assembly 20 is shown having a forward housing portion 22, having ribs 24 to provide for easy gripping by the user. A barrel cap or rearward housing portion 26 has a forward portion receiving the rearward portion of forward housing 22 and is affixed thereto by means of set screw 28 as shown in FIG. 2. A mushroom cap 30 preferably of a nylon type material such as sold under the trademark Delrin is frictionally mounted to the rearward end of the barrel cap 26.

The forward housing portion 22 has a forward bore 32 extending axially and partially through the forward housing portion 22. For purposes of description, the right hand side of the probe assembly shown in FIG. 2 shall be the forward end and the left hand side the rearward end. The bore 32 is open at the forward end and closed at the rearward end. Two current injection segments 34 and 36 for injecting current into a through hole are mounted in bore 32. These segments are of identical construction and one such segment is depicted in FIGS. 4, 5 and 6. Each segment has a rearward portion 38 having a semi-circular cross-section as shown in FIG. 5 and having a forward rectangular block 39 which has its forward end shaped to form, preferably but by way of illustration only, a cone half 40 as shown in FIGS. 4, 5 and 6. This cone half 40 is a forward tip portion of the current injection segments for engaging the through hole.

The two current injection segments are made preferably of stainless steel. Before mounting in the housing of probe assembly 20 the two current injection segments are positioned with the flat sides of the rearward portions 38 adjacent to one another. A current injection electrode is thus provided having a rearward portion which has a cylindrical cross-section and which is mounted in the bore 32.

Each of the current injection segments has a slot 42 as shown in FIGS. 4, 5 and 6 through which an electrically non-conductive pin 48 is inserted after the current injection segments 34 and 36 are positioned inside bore 32. This pin 48 extends through bores 46 extending through opposite sides of the forward housing portion 22 and through the slots 42. The pin 48 is adhesively or press fit mounted in bore 46 and serves to hold the two current injection segments 34 and 36 in the bore 32.

Figure 3:
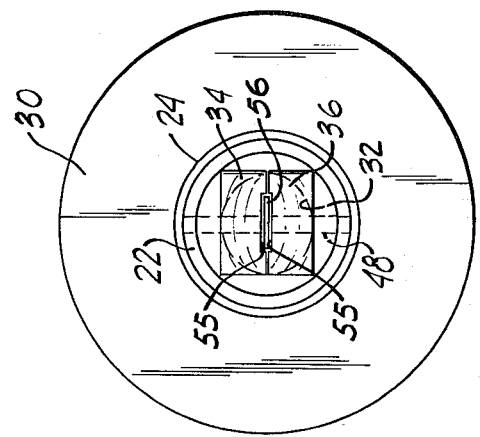
FIG. 3 is a front view of the probe shown in FIG. 2.

A spring 50 is compressively positioned between the rearward ends of the current injection segments 34 and 36 and the closed end of bore 32. Thus, the spring 50 biases the current injection segments in a forward position. Pin 48 acting against rearward edge of slot 42 acts as a stop means for limiting or stopping the forward movement of the current injection segments 34 and 36. The forward edge of the slot 42 which rests against the pin 48 when the current injection segments are moved in the rearward direction also acts as a stop means for limiting or stopping the rearward movement of the current injection segments. Rearward movement of current injection segments 34 and 36 may also be limited by the corner portions of the rearward face of rectangular block 39 striking the forward edge of forward housing 22 as shown in FIG. 3. Either stop means may be used to limit this rearward movement of current injection segments 34 and 36 and both are considered to be within the scope of the present invention.

Each current injection segment also has a longitudinal channel 54 as shown in FIGS. 4, 5 and 6. A voltage electrode spear 56 also preferably made of stainless steel and having a rectangular cross-section is positioned in the space bounded by the sides of the channel 54 as shown in FIG. 3. The voltage electrode spear 56 is shown in FIGS. 7 and 8. The voltage spear 56 also has a slot 62 as shown in FIG. 7 through which the pin 48 extends to hold the voltage spear in the housing as shown in FIG. 2. The rearward edge of slot 62 provides a limit on the forward movement of the voltage spear 56 and the forward edge of slot 62 limits the rearward movement of voltage spear 56.

The rearward portion of the voltage spear 56 is inserted in a slot 58 formed in an electrode holder 60 and soldered thereto. A rod like element 64 is soldered to the electrode holder 60 which has an enlarged diameter portion 66 which is mounted in a spring probe housing 68. A spring 70 is mounted compressively in the spring probe housing 68 between the rearward end of enlarged diameter portion 66 and a rearward closed end of spring probe housing 68. This spring 70 biases the rod 64 and thus the voltage spear 56 in a forward direction. The shoulder formed at the enlarged portion 66 on rod 64 engages a forward bent-in portion of housing 68 to retain the enlarged portion 66 and spring 70 in the spring probe housing 68. Preferably, the forward movement of the voltage spear 56 is limited so that when the current injection segments 34 and 36 do not engage a through hole, the voltage spear is slightly recessed from the forward tips of the current injection segments 34 and 36. Thus, in a preferred embodiment the current injection segments 34 and 36 serve to protect the voltage spear 56 from damage when the probe assembly is not being useful.

In the rearward end of each of the current injection segments 34 and 36, there is provided a bore 72 as shown in FIGS. 4, 5 and 6. In the bores 72, are mounted current posts 76 and 78 respectively as shown in FIG. 2. Current posts 76 and 78 are preferably constructed of brass and soldered to the respective current injection segment. The current posts 76 and 78 slidably extend through bores 80 and 82 respectively in the rearward end of forward housing portion 22. Thus, when the current injection segments 34 and 36 move rearwardly, the current posts 76 and 78 move rearwardly also.

The spring probe housing 68 is mounted in a bore 69 and is held in place by a pressure-fit provided by an annular bulge 71 on spring probe housing 68 which depresses the wall of bore 69 at 73 as shown in FIG. 2.

Electrical current is provided to the current posts 76 and 78 through current leads 84 and 86 which are soldered to the respective current posts. The current leads are carried by the cable 88 which is brought into the housing through bore 89 in the barrel cap 26. A voltage lead 90 also carried by the cable 88 is soldered to the spring probe housing 68 and is thereby connected to the voltage electrical spear 56. The channel 52 of each current injection segments 34 and 36 is coated with an insulating material 55 such as material marketed under the trademark Teflon. This insulating material provides electrical insulation between the current injection segments 34 and 36 and the voltage spear 56 as shown in FIGS. 2 and 3.

The operation of the probe unit 20 will now be described with reference to FIGS. 2 and 9. In order to make a measurement of electrical conductivity or resistivity of a plated through hole, two probe units must be used, one located on each side of the through hole of a circuit board workpiece as shown in FIG. 9. This is the arrangement for using the Kelvin or four-point technique of measuring conductivity or resistivity of a through hole. The probe 20 may be used in conjunction with another similar probe 20a as shown in FIG. 9. The probe units 20 and 20a are positioned axially with a plated through hole 88 in a circuit board 90. In discussing the operation of this probe unit, only probe unit 20 will be discussed. Probe 20a operates in a similar manner. The probe unit 20 is pushed by the user into the through hole 88 until the current injection segments 34 and 36 are moved to their most rearward position. The voltage electrode spear 56, normally recessed behind the forward tip of the current injection segments 34 and 36 prior to the time the current injection segments engage the through hole 88, becomes exposed when these segments move rearwardly with respect to the forward housing 22 against the biasing force of spring 50 as shown in FIG. 2. The voltage spear 56 then engages the circular edge of the through hole 88 on opposite sides of the through hole. Since the voltage electrode spear 56 engages the through hole at two places better electrical contact is insured than with the conventional one place contact. Furthermore, since each of the current injection segments 34 and 36 are independently movable, errors caused by imperfections and discontinuities in the circular edge are reduced and superior current injection in approximately 360° of the through hole is achieved. Furthermore, the construction of probe 20 with the independently movable current injection segments allows a user a certain amount of flexibility in axially positioning the probe with the through hole. Therefore the probe need not be perfectly aligned perpendicular to the circuit board workpiece.

The current leads 84 and 86 and the voltage lead 90 of probe 20 and the corresponding leads of probe 20a are directed to a readout unit or meter (not shown) which supplies current to the current injection segments of one probe unit and a current return path through the current injection segments of the other probe. The voltage measurement is made across the through hole between the voltage electrode spears of the two probes and is directed via the voltage leads 90 to the readout unit. The readout unit coverts the voltage measurement into utilizable intelligence such as the conductivity or resistivity of the through hole. A readout device which may be used, for example, is the CAVIDERM Model CD-6 manufactured by UPA Technology, Inc.

While the fundamental novel features of the invention have been shown and described, it should be understood that various substitutions, modifications and variations may be made by those skilled in the art without departing from the spirit or scope of the invention. Accordingly, all such modification and variations are included in the scope of the invention as defined by the following claims:

I claim:

1. In apparatus for measuring the conductivity of a plated coating on a wall defining a circular hole of a through hole in a circuit board workpiece, an improved electrode probe comprising:

an elongate housing having a longitudinal axis;

a segmented first electrode assembly having an interstice between adjacent segments and located in the housing with a forward tip portion of such first electrode assembly extending beyond a forward end of the housing;

the tip portion of the first electrode assembly shaped to engage substantially 360° of a circular edge formed by the intersection of the wall defining the through hole and the surface of the circuit board workpiece;

a second electrode assembly mounted in the housing in the interstice between segments of the first electrode assembly, the second electrode assembly having a forward tip portion disposed adjacent the tip portion of the first electrode assembly and shaped to engage multiple points of such circular edge when the forward tip portion of the first electrode assembly is positioned to engage the circular edge; and insulating means between the first and second electrode assemblies for electrically insulating these assemblies from one another.

2. The improved electrode probe according to claim 1 wherein the segments of the first electrode assembly are mounted in the housing for relative movement with respect to one another in a direction parallel to the longitudinal axis of the housing.

3. The improved electrode probe according to claim 2 further including biasing means mounted in the housing for biasing the first electrode assembly in the forward direction, first stop means for each segment for limiting the forward movement of each segment, and second stop means for each segment for limiting the rearward movement of each segment.

4. The improved electrode probe according to claim 3 wherein the forward tip portion of the second electrode assembly is disposed rearwardly of the forward tip portion of the first electrode assembly when the segments of the first electrode assembly are resting against the first stop means, whereby the forward tip portion of the second electrode assembly is protected by the forward tip portion of the first electrode assembly when the first electrode assembly is not positioned to engage the circular edge and further disposed such that when the forward tip portion of the first electrode assembly is positioned to engage the circular edge and the first electrode assembly is moved rearwardly the second electrode assembly is exposed for engagement with the circular edge.

5. The improved electrode probe according to claim 1 wherein the second electrode assembly is movable in a direction parallel to the longitudinal axis of the housing.

6. The improved electrode probe according to claim 5 further including a bias means mounted in the housing for biasing the second electrode assembly in the forward direction, first stop means for limiting the forward movement of the second electrode assembly and second stop means for limiting the rearward movement of this second electrode assembly.

7. The improved electrode probe according to claim 1 wherein the first electrode assembly comprises a pair of segments each constituting a half of such assembly.

8. The improved electrode probe according to claim 7 wherein the second electrode assembly comprises a knife blade with the forward tip portion shaped to conform to the contour of the adjacent portion of the forward tip portions of the halves of the first electrode assembly.

9. The improved electrode probe according to claim 1 wherein the forward tip portion of the first electrode assembly comprises a pair of segments forming two halves of a cone.

10. The improved electrode probe according to claim 9 wherein the second electrode assembly comprises a knife blade with a triangular shaped forward tip portion for contacting the circular edge at two points.

11. The improved electrode probe according to claim 1 wherein the first electrode assembly is used to inject current into the through hole and the second electrode assembly is used to measure the voltage drop across the through hole.

12. In apparatus for measuring the conductivity of a plated coating on a wall defining a circular hole of a through hole in a circuit board workpiece, an improved electrode probe comprising:

an elongate housing having a longitudinal axis;

a segmented first electrode assembly having an interstice between adjacent segments and located in the housing with a forward tip portion extending beyond a forward end of the housing;

each segment mounted in the housing for relative movement with respect to one another in a direction parallel to the longitudinal axis of the housing;

the tip portion of the first electrode assembly shaped to engage substantially 360° of a circular edge formed by the intersection of the wall defining the through hole and the surface of the circuit board workpiece;

a second electrode assembly mounted in the housing in the interstice between segments of the first electrode assembly, the second electrode assembly movable in a direction parallel to the longitudinal axis of the housing and having a forward tip portion disposed adjacent the tip portion of the first electrode assembly and shaped to engage multiple points of such circular edge when the forward tip portion of the first electrode assembly is positioned to engage the circular edge; and insulating means between the first and second electrode assemblies for electrically insulating these assemblies from one and another.

13. The improved electrode probe according to claim 12 further including biasing means mounted in the housing for biasing the first electrode assembly in the forward direction, first stop means for each segment for limiting the forward movement of each segment, and second stop means for each segment for limiting the rearward movement of each segment.

14. The improved electrode probe according to claim 13 wherein the forward tip portion of the second electrode assembly is disposed rearwardly of the forward tip portion of the first electrode assembly when the segments of the first electrode assembly are resting against the first stop means, whereby the forward tip portion of the second electrode assembly is protected by the forward tip portion of the first electrode assembly when the first electrode assembly is not positioned to engage the circular edge and further disposed such that when the forward tip portion of the first electrode assembly is positioned to engage the circular edge and the first electrode assembly is moved rearwardly the second electrode assembly is exposed for engagement with the circular edge.

15. The improved electrode probe according to claim 14 further including a bias means mounted in the housing for biasing the second electrode assembly in the forward direction, first stop means for limiting the forward movement of the second electrode assembly and second stop means for limiting the rearward movement of this second electrode assembly.

16. The improved electrode probe according to claim 15 wherein the forward tip portion of the first electrode assembly comprises a pair of segments forming two halves of a cone.

17. The improved electrode probe according to claim 16 wherein the second electrode assembly comprises a knife blade with a triangular shaped forward tip portion for contacting the circular edge at two points.

18. The improved electrode probe according to claim 17 wherein the first electrode assembly is used to inject current into the through hole and the second electrode assembly is used to measure the voltage drop across the through hole.

* * * * *